United States Patent [19]
John

[11] Patent Number: 6,002,638
[45] Date of Patent: Dec. 14, 1999

[54] MEMORY DEVICE HAVING A SWITCHABLE CLOCK OUTPUT AND METHOD THEREFOR

[75] Inventor: Nathan John, Chandler, Ariz.

[73] Assignee: Microchip Technology Incorporated, Chandler, Ariz.

[21] Appl. No.: 09/009,197

[22] Filed: Jan. 20, 1998

[51] Int. Cl.[6] ...................................................... G11C 8/00
[52] U.S. Cl. ....................................... 365/233; 365/189.08
[58] Field of Search ................................. 365/233, 189.08

[56] References Cited

U.S. PATENT DOCUMENTS

| | | | |
|---|---|---|---|
| 5,336,950 | 8/1994 | Popli et al. | 365/195 |
| 5,544,107 | 8/1996 | Hill | 365/201 |

Primary Examiner—David Nelms
Assistant Examiner—M. Tran
Attorney, Agent, or Firm—Frohwitter; Paul N. Katz; Ronald L. Chichester

[57] ABSTRACT

A memory device with a switchable clock output. The memory device has a data pin, a clock input pin, and a clock output pin. The memory device is designed to be wired up to a plurality of other memory devices in a daisy chain manner. The clock input pin of the first memory device would be serially coupled to the first memory device. The clock output pin of each memory device would be serially coupled to the clock input pin of a directly successive memory device. The processor can then interrogate the first memory device for the identification information it contains. Once this information is obtained, the processor can issue a command to deactivate the first memory device from responding to bus commands, as well as to output the clock signal via the clock output pin to a directly successive memory device. The processor may then interrogate the next memory device.

18 Claims, 3 Drawing Sheets

6,002,638

MEMORY DEVICE HAVING A SWITCHABLE CLOCK OUTPUT AND METHOD THEREFOR

BACKGROUND OF THE INVENTION

1. Field of the Invention

This invention relates generally to memory devices and, more specifically, to a memory device having a switchable clock output pin which will allow for board identification in systems having a plurality of circuit boards.

2. Description of the Prior Art

Presently the standard $I^2C$ serial Electrical Erasable Programmable Read Only Memory (EEPROM) device has data and clock inputs. The EEPROM device is designed to have the clock and data signals bussed to each EEPROM device in parallel. Addressing of each individual EEPROM device is accomplished by three address pins which couple each EEPROM device to the computer system. The problem with this approach is that the three address pins limit the total number of EEPROM devices that may be coupled to the clock and data lines to eight. A further problem with $I^2C$ devices being used for board identification for electronic circuit boards is the requirement for the three address pins to be routed to the electronic circuit board connector. This requirement consumes extra connector pins which could be used for different and more important functions.

Therefore, a need existed to provide an improved electronic circuit board and method therefor. The addressing of the improved electronic circuit board must not require the three address pins which are currently being used. This will allow more electronic circuit boards to be placed on the clock and data bus lines. The removal of the requirement of the three address pins will also free up extra connector pins which may be used for different and more important functions. A need further existed to provide an improved method for board identification in systems which use a plurality of electronic circuit boards. The new method must increase the total number of electronic circuit boards which may be placed on the clock and data signal lines.

SUMMARY OF THE INVENTION

In accordance with one embodiment of the present invention, it is an object of the present invention to provide an improved electronic circuit board.

It is another object of the present invention to provide an improved electronic circuit board wherein addressing of the improved electronic circuit board will not require the three address pins currently being used.

It is still another object of the present invention to provide an improved electronic circuit board wherein addressing of the improved electronic circuit board will not require the three address pins currently being used thereby allowing more electronic circuit boards to be placed on the clock and data bus lines.

It is yet another object of the present invention to provide an improved electronic circuit board wherein addressing of the improved electronic circuit board will not require the three address pins currently being used thereby freeing up extra connector pins which may be used for different and more important functions.

It is still another object of the present invention to provide an improved method for board identification in a system which uses a plurality of electronic circuit boards.

It is still a further object of the present invention to provide an improved method for board identification in a system which uses a plurality of electronic circuit boards which will increase the number of electronic circuit boards that may be placed on the clock and data signal lines.

BRIEF DESCRIPTION OF THE PREFERRED EMBODIMENTS

In accordance with one embodiment of the present invention, a memory device having a switchable clock output is disclosed. The memory device has a plurality of pins which are coupled thereto. One of the pins is a data pin for transferring data to and from a processor unit. Another one of the pins is a clock input pin for receiving a clock signal. Yet another one of the pins is a clock output pin for outputting the clock signal. The clock output pin will only output the clock signal after the electronic circuit board receives a switch command from the processor unit.

In accordance with another embodiment of the present invention, a system for board identification where a plurality of circuit boards may be used is disclosed. The system has a clock signal line and a data signal line. A plurality of circuit boards are coupled to the data signal line. Each of the circuit boards has a memory device coupled thereto for storing information to uniquely identify each circuit board. Each memory device has a plurality of pins coupled thereto. One of the plurality of pins of each memory device is a data pin coupled to the data signal line. The data pin is used for transferring data to and from a processor unit. Another one of the plurality of pins of each memory device is a clock input pin, while still another pin of the plurality of pins is a clock output pin. The clock input pin of the first memory device is coupled to the clock signal line. Each clock input pin of the remainder of the memory devices is coupled to a clock output pin of a directly previous memory device. The clock input pin is used for receiving the clock signal outputted by the directly previous memory device after the directly previous memory device has received a switch command from the processor unit.

In accordance with still another embodiment of the present invention, a method for board identification where a plurality of circuit boards are used is disclosed. The method comprises the steps of: providing a clock signal line; providing a data signal line; providing a plurality of circuit boards coupled to the data signal line; providing a memory device coupled to each of the plurality of circuit boards for storing information to uniquely identify each circuit board, each memory device having a plurality of pins coupled thereto, wherein one of the plurality of pins of each memory device is a data pin coupled to the data signal line, wherein one of the plurality of pins of each memory device is a clock input pip and wherein one of the plurality of pins of each memory device is a clock output pin; coupling a clock input pin of a first memory device to the clock signal line; coupling the clock output pins of each memory device to the clock input pin of a directly successive memory device; interrogating the first memory device by a processor unit coupled to the clock signal line and to the data signal line; and sending a command from the processor unit to the first memory device for the clock output pin of the first memory device to output the clock signal to the clock input pin of a directly successive memory device.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENTS

Figure 1:
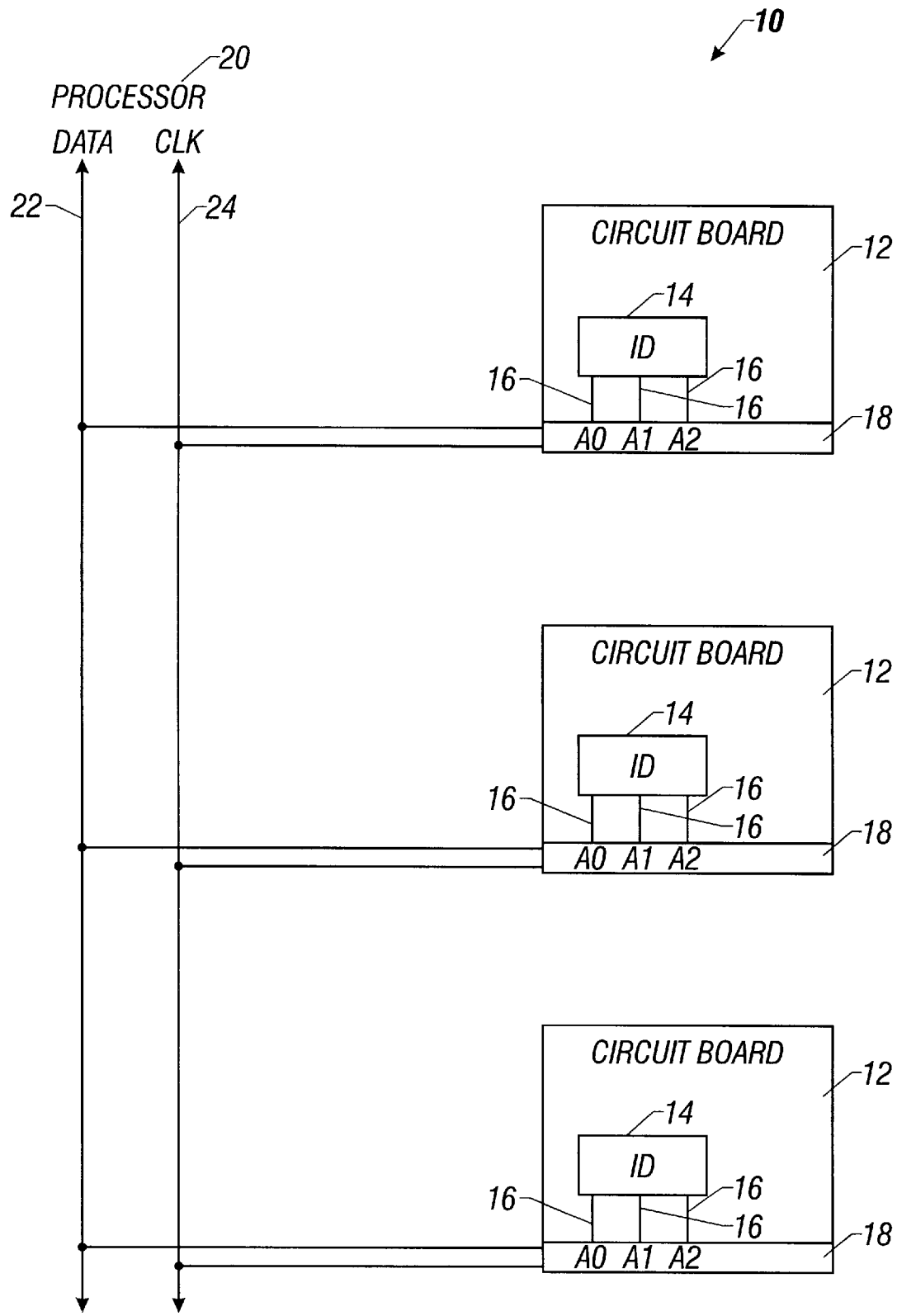
FIG. 1 is a simplified block diagram of a prior art electronic circuit board system.

Referring to FIG. 1, a standard prior art I²C electronic circuit board system 10 (hereinafter system 10) is shown. The system 10 has a plurality of electronic circuit boards 12. Each electronic circuit board 12 has an identification section 14. The identification section 14 is used to store information to uniquely identify each electronic circuit board 12. The information is used for locating each particular electronic circuit board 12 on the system 10.

In a standard I²C configuration, the identification section 14 uses three pins 16 to establish a hardware address location for each electronic circuit board 12. Each of the pins 16 is coupled to a connector 18. The connector 18 will set each pin 16 to a high or a low logic state by grounding or applying a voltage to each of the pins 16. The high-low combination of the pins 16 will establish a unique binary address for each electronic circuit board 12.

Each electronic circuit board 12 is coupled to a processor unit 20 via data and clock signal lines 22 and 24 respectively. The data and clock signal lines 22 and 24 respectively, generally comprise a serial two-wired bus. The serial two wired bus is generally dedicated to identify which type of electronic circuit board 12 is on the system 10. The processor unit 20 generally sends an address across the serial two-wired bus which will match only one of the electronic circuit boards 12. Thus, when the address is sent out by the processor unit 20, only one of the electronic circuit boards 12 will respond.

The problem with this approach is that the three address pins 16 limit the total number of electronic circuit boards 12 that may be coupled to the data and clock lines 22 and 24 respectively, to eight (i.e., for a binary addressing $2^3$). A further problem with I²C devices being used for board identification for electronic circuit boards 12 is that too many pins on the connector 18 are required for board identification. The system 10 requires five (5) pins on the connector 18 to be used for board identification: 1) data pin, 2) clock input pin, 3) address pin A0, 4) address pin A1, and 5) address pin A2). The requirement that the three address pins A0, A1, and A2 be routed to the electronic circuit board connector 18 consumes extra connector pins which could be used for different and more important functions.

Figure 2:
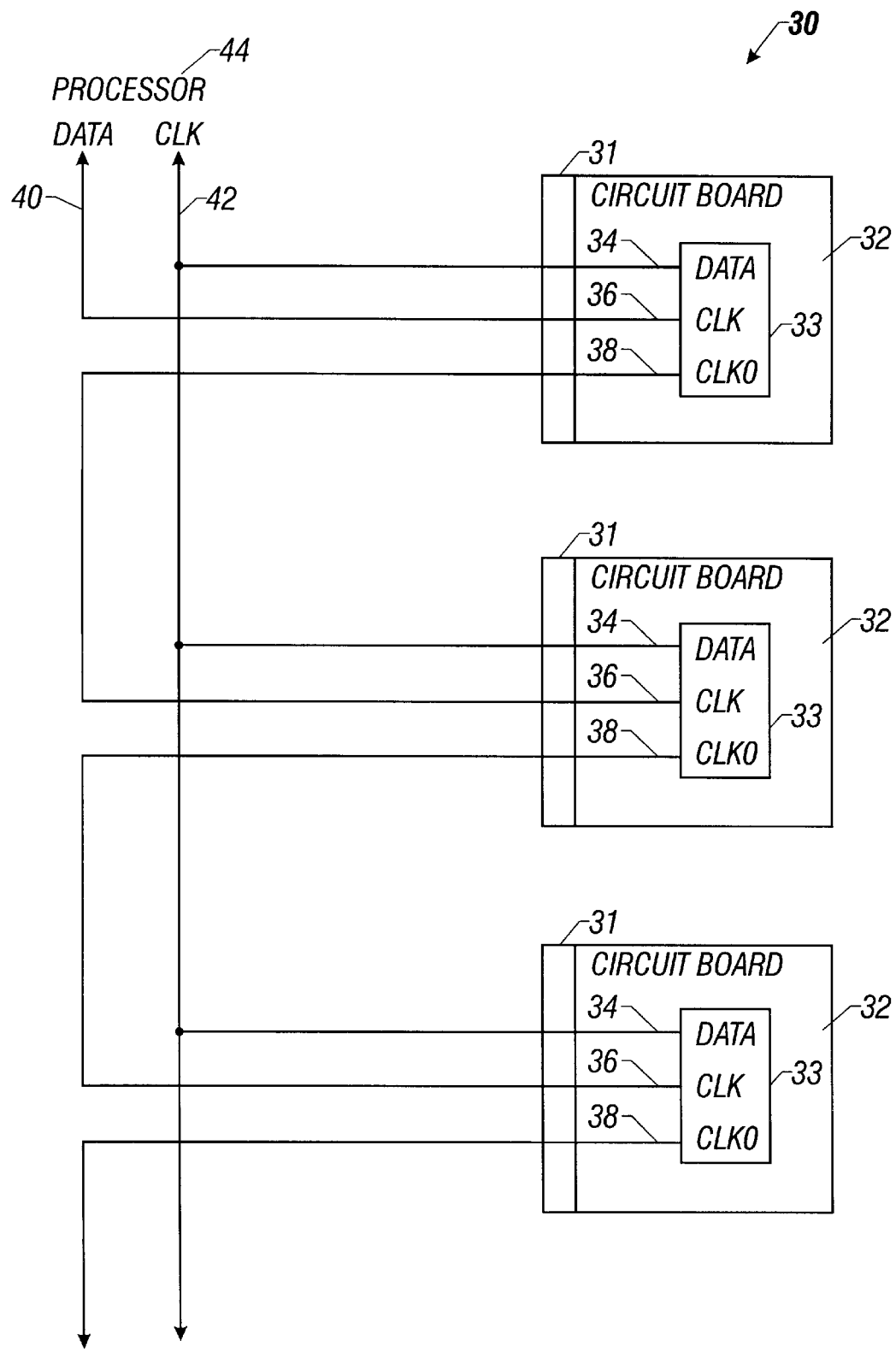
FIG. 2 is a simplified block diagram of the electronic circuit board system of the present invention which is used for board identification in a system having a plurality of electronic circuit boards.
Figure 3:
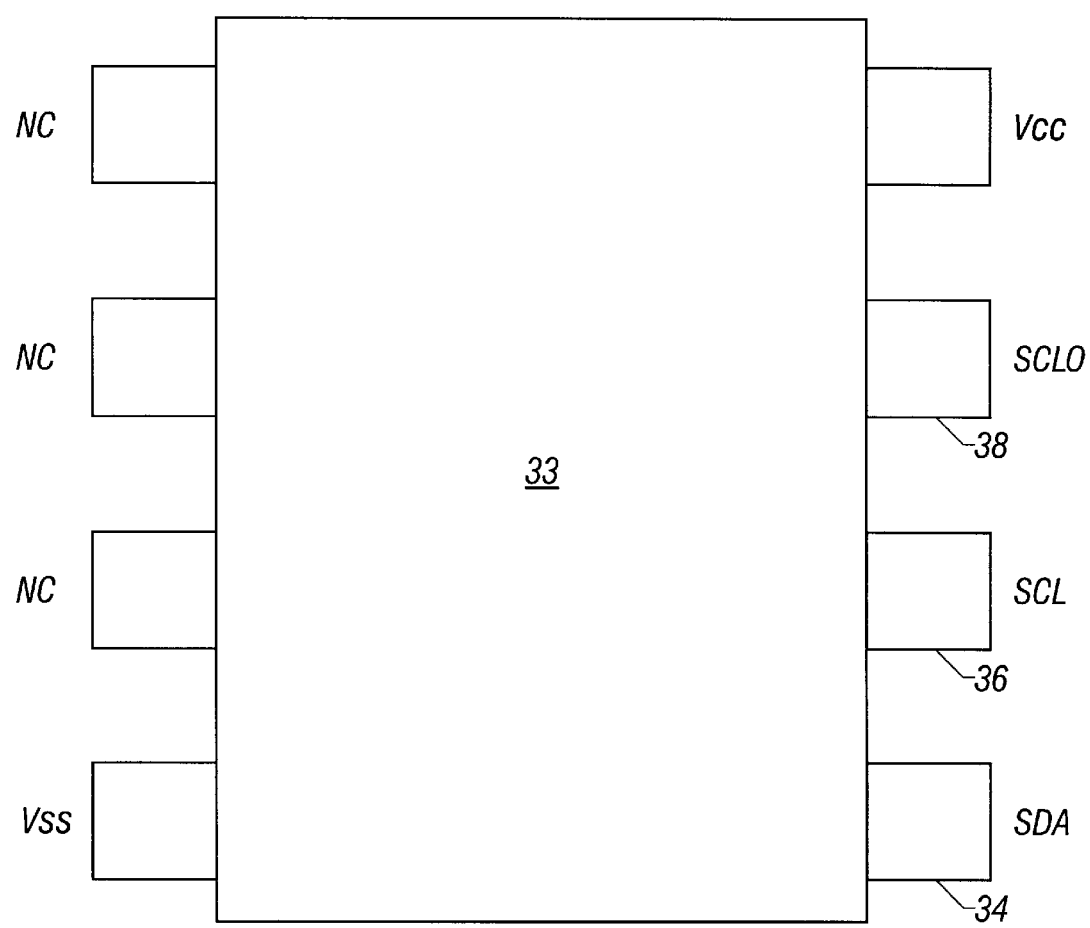
FIG. 3 is a simplified block diagram of the pin layout for a memory device used in the electronic circuit boards depicted in FIG. 2.

Referring to FIGS. 2 and 3, a system for board identification where a plurality of electronic circuit boards 30 may be used (hereinafter system 30) is shown. The system 30 also has a plurality of electronic circuit boards 32. Each electronic circuit board 32 uses a connector 31 to couple the electronic circuit board 32 to the system 30.

The system 30 uses a clock signal line 40 and a data signal line 42. Both of the signal lines 40 and 42 are generally coupled to a processor unit 44. Like the prior art, the clock signal line 40 and data signal lines 42 comprise a serial two-wired bus. The serial two wired bus is generally dedicated to identify which type of electronic circuit board 32 is on the system 30.

Each of the electronic circuit boards 32 has a memory device 33 coupled thereto. The memory device 33 is used to store information to uniquely identify each electronic circuit board 32. This information is used for locating each particular electronic circuit board 32 on the system 30. The memory device 33 is generally any type of nonvolatile memory device. In the preferred embodiment of the present invention, the memory device 33 is a Electrical Erasable Programmable Read Only Memory (EEPROM). However, it should be noted that any type of nonvolatile memory device will work.

Each memory device 33 has a plurality of Input-Output (I/O) pins. One of the I/O pins is a data input pin 34. The data input pin 34 is used for transferring data to and from the memory device 33. The memory device 33 also has a clock input pin 36. The clock input pin 36 is used for allowing the electronic circuit board 32 to receive a clock input signal. One of the unique aspects of the memory device 33 is the use of a clock output pin 38. The clock output pin 38 is used to allow the electronic circuit board 32 to output a mirror image of the clock input signal. The clock output pin 38 is designed to allow each of the electronic circuit boards 32 to be coupled together in a daisy chained configuration. Thus, the clock signal line 40 will be coupled to the clock input pin 36 of the first electronic circuit board 32. The clock output pin 38 of the first electronic circuit board 32 will be serially coupled to the clock input pin 36 of a directly successive electronic circuit board 32. Thus, the clock output pin 38 of each electronic circuit board 32 will be serially coupled to the clock input pin 36 of a directly successive electronic circuit board 32.

On power up of the system 30, the clock output of each electronic circuit board 32 is tri-stated. The processor unit 44 will then interrogate the first electronic circuit board 32 for identification information contained within the first electronic circuit board 32. None of the other electronic circuit boards 32 may respond since the clock signal is not passed through to any of the other electronic circuit boards 32. Once the processor unit 44 has obtained all of the requisite identification information, the processor unit 44 will issue a switch command. The switch command will deactivate the first electronic circuit board 32 from responding to any bus commands. The switch command will also activate the clock output pin 38 of the first electronic circuit board 32 to output a mirror image of the clock signal received by the clock input pin 36. It is therefore possible for the next electronic circuit board 32 (directly successive electronic circuit board 32 (i.e., the second electronic circuit board 32)) to be interrogated by the processor unit 44. The system 30 therefore makes it possible to sequentially address multiple electronic circuit boards 32 by only having one active electronic circuit board 32 at any one time. It should be noted that the processor unit 44 may also issue a command that would switch the electronic circuit board 32 back to its original state.

The electronic circuit boards 32 do not require the three address pins which are used in the prior art system 10. Thus, the system 30 is not limited to a specific number of electronic circuit boards 32. This will allow more electronic circuit boards 32 to be placed on the clock and data bus lines 40 and 42. The removal of the requirement of the three address pins will also free up extra pins on the connector 31. The connector 31 only requires three (3) pins to be used for board identification as contrasted to the five pins required in the prior art system 10. Thus, the extra pins may be used for different and more important functions.

While the invention has been particularly shown and described with reference to preferred embodiments thereof, it will be understood by those skilled in the art that the foregoing and other changes in form, and details may be made therein without departing from the spirit and scope of the invention.

I claim:

1. A memory device having a switchable clock output, comprising, in combination:
   a nonvolatile electrically erasable programmable read only memory (EEPROM);
   a plurality of pins coupled to said nonvolatile EEPROM;
   wherein one of said plurality of pins is a data pin for transferring data to and from a processor unit;
   wherein one of said plurality of pins is a clock input pin for receiving a clock signal; and
   wherein one of said plurality of pins is a clock output pin for outputting said clock signal.

2. A memory device having a switchable clock output in accordance with claim 1 wherein said clock output pin only outputs said clock signal after said nonvolatile EEPROM has been interrogated by said processor unit.

3. A memory device having a switchable clock output in accordance with claim 1 wherein said clock output pin only outputs said clock signal when said nonvolatile EEPROM receives a switch command.

4. A system for board identification where a plurality of circuit boards may be used comprising, in combination:
   a clock signal line;
   a data signal line;
   a first circuit board coupled to said clock signal line and to said data signal line, wherein said first circuit board has a first memory device coupled thereto for storing information to uniquely identify said first circuit board, said first memory device having a plurality of pins coupled thereto;
     wherein one of said plurality of pins of said first memory device is a data pin coupled to said data signal line for transferring data to and from a processor unit;
     wherein one of said plurality of pins of said first memory device is a clock input pin coupled to said clock signal line for receiving a clock signal from said clock signal line;
     wherein one of said plurality of pins of said first memory device is a clock output pin for outputting said clock signal; and
   a second circuit board coupled to said data signal line and to said first circuit board, wherein said second circuit board has a second memory device coupled thereto for storing information to uniquely identify said second circuit board, said second memory device having a plurality of pins coupled thereto;
     wherein one of said plurality of pins of said second memory device is a data pin coupled to said data signal line for transferring data to and from said processor unit;
     wherein one of said plurality of pins of said second memory device is a clock input pin coupled to said clock output pin of said first memory device for receiving said clock signal outputted by said first memory device;
     wherein one of said plurality of pins of said second memory device is a clock output pin for outputting said clock signal.

5. A system for board identification where a plurality of circuit boards may be used in accordance with claim 4 wherein said clock output pin of said first memory device outputs said clock signal after said first memory device receives a switch command from said processor unit.

6. A system for board identification where a plurality of circuit boards may be used in accordance with claim 4 wherein said clock output pin of said second memory device outputs said clock signal after said second memory device receives a switch command from said processor unit.

7. A system for board identification where a plurality of circuit boards may be used in accordance with claim 4 wherein said first memory device and said second memory device are both EEPROMs.

8. A system for board identification where a plurality of circuit boards may be used in accordance with claim 4 wherein said clock output pin of said first memory device is serially coupled to said clock input pin of said second memory device.

9. A system for board identification where a plurality of circuit boards may be used in accordance with claim 6 further comprising:
   a plurality of circuit boards coupled to said data signal line, wherein said plurality of circuit boards each have a memory device coupled thereto for storing information to uniquely identify each circuit board, each memory device having a plurality of pins coupled thereto;
     wherein one of said plurality of pins of each memory device is a data pin coupled to said data signal line for transferring data to and from a processor unit;
     wherein one of said plurality of pins of each memory device is a clock output pin
     wherein the memory devices of said plurality of circuit boards are electrically connected in series in that the clock input pin of each memory device is coupled to the clock output pin of a directly previous memory device for receiving said clock signal outputted by said directly previous memory device and each clock output pin is for outputting said clock signal to said clock input pin of a directly successive memory device.

10. A system for board identification where a plurality of circuit boards may be used in accordance with claim 9 wherein a clock output pin of a corresponding memory devices outputs said clock signal after said corresponding memory device receives a switch command from said processor unit.

11. A system for board identification where a plurality of circuit boards may be used in accordance with claim 10 wherein each memory device is a serial EEPROM.

12. A system for board identification where a plurality of circuit boards may be used in accordance with claim 9 wherein each clock output pin of each of each memory devices is serially coupled to said clock input pin of said directly successive memory device.

13. A system for board identification where a plurality of circuit boards may be used in accordance with claim 4 wherein said clock signal line and said data signal line are a serial two-wire bus dedicated to identify type of memory device on said system.

14. A method for board identification where a plurality of circuit boards are used comprising the steps of:
   providing a clock signal line;
   providing a data signal line;
   providing a plurality of circuit boards coupled to said data signal line;
   providing a memory device coupled to each of said plurality of circuit boards for storing information to uniquely identify each circuit board, each memory device having a plurality of pins coupled thereto, wherein one of said plurality of pins of each memory device is a data pin coupled to said data signal line, wherein one of said plurality of pins of each memory device is a clock input pin, and wherein one of said plurality of pins of each memory device is a clock output pin;

coupling a clock input pin of a first memory device to said clock signal line;

coupling said clock output pins of each memory device to a clock input pin of a directly successive memory device, whereby the memory devices are electrically connected in series with each other;

interrogating said first memory device by a processor unit coupled to said clock signal line and to said data signal line; and sending a command from said processor unit to said first memory device for said clock output pin of said first memory device to output said clock signal to said clock input pin of the directly successive memory device in series.

15. The method of claim 14 further comprising the step of interrogating said directly successive memory device by said processor unit.

16. The method of claim 15 further comprising the steps of:

sending a command from said processor unit to a current memory device that has just been interrogated by said processor unit for said clock output pin of said current memory device to output said clock signal to said clock input pin of a directly successive memory device; and interrogating said directly successive memory device by said processor unit.

17. The method of claim 14 further comprising the step of serially coupling said clock output pin of each memory device to said clock input pin of said directly successive memory device.

18. A system for board identification where a plurality of circuit boards may be used comprising, in combination:

a clock signal line;

a data signal line;

a plurality of circuit boards coupled to said data signal line, wherein said plurality of circuit boards each have a memory device coupled thereto for storing information to uniquely identify each circuit board, each memory device having a plurality of pins coupled thereto, each memory device having a data pin, a clock input pin, and a clock output pin;

wherein said clock input pin of a first memory device is coupled to said clock signal line and each clock input pin of each successive memory device is coupled to said clock output pin of a directly preceding memory device, whereby the memory devices are electrically connected in series for receiving said clock signal outputted by said directly preceding memory device after said directly preceding memory device has been interrogated by said processor unit;

wherein each data pin of each memory device is coupled to said data signal line for transferring data to and from a processor unit after a directly previous memory device has been interrogated by said processor unit.

* * * * *